United States Patent
Schmidt

(10) Patent No.: US 6,859,140 B2
(45) Date of Patent: Feb. 22, 2005

(54) INDEPENDENTLY EXCITED PROXIMITY OR PRESENCE SWITCH ARRANGEMENT

(75) Inventor: Ralf Schmidt, Freinsheim (DE)

(73) Assignee: Senstronic, Saverne (FR)

( * ) Notice: Subject to any disclaimer, the term of this patent is extended or adjusted under 35 U.S.C. 154(b) by 161 days.

(21) Appl. No.: 10/216,788

(22) Filed: Aug. 13, 2002

(65) Prior Publication Data

US 2003/0030566 A1 Feb. 13, 2003

(30) Foreign Application Priority Data

Aug. 13, 2001 (EP) .............................................. 01440262

(51) Int. Cl.[7] .............................................. G08B 13/18
(52) U.S. Cl. ..................... 340/552; 340/561; 340/562; 324/662
(58) Field of Search ................................. 340/552, 561, 340/562, 686.6; 324/662, 639

(56) References Cited

U.S. PATENT DOCUMENTS

| | | | | |
|---|---|---|---|---|
| 4,101,791 A | * | 7/1978 | Atkins et al. ................ | 327/517 |
| 4,144,529 A | * | 3/1979 | Miller et al. ................. | 340/562 |
| 4,598,276 A | * | 7/1986 | Tait .......................... | 340/572.5 |
| 4,792,764 A | | 12/1988 | Walker et al. | |
| 5,576,627 A | * | 11/1996 | McEwan ..................... | 324/639 |
| 5,986,549 A | * | 11/1999 | Teodorescu ................. | 340/561 |
| 6,518,776 B2 | * | 2/2003 | Charneau et al. ........... | 324/662 |

FOREIGN PATENT DOCUMENTS

| | | |
|---|---|---|
| DE | 34 40 538 | 5/1986 |
| DE | 41 16 757 | 8/1992 |
| DE | 196 14 528 | 10/1997 |
| DE | 199 46 917 | 4/2001 |

\* cited by examiner

*Primary Examiner*—John Tweel
(74) *Attorney, Agent, or Firm*—Young & Thompson

(57) ABSTRACT

The invention relates to a proximity or presence switch arrangement operating in accordance with the inductive principle, comprising at least one inductor integrated in an oscillating circuit and an electronic control and evaluation device connected downstream for sensing or detecting the approach and/or presence of a material influencing electromagnetic fields.

15 Claims, 2 Drawing Sheets

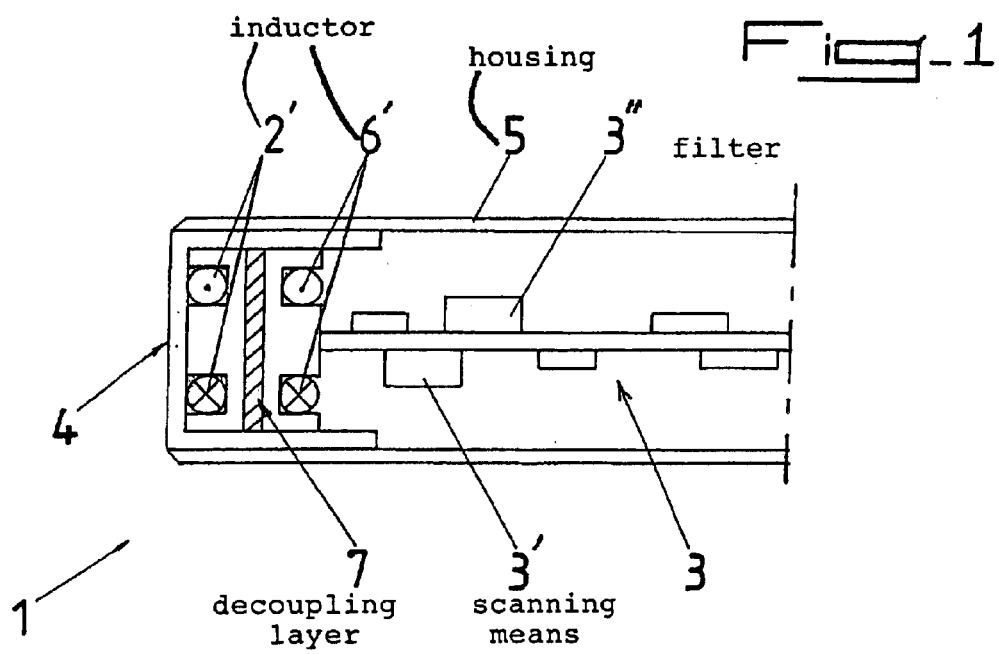
Fig_1
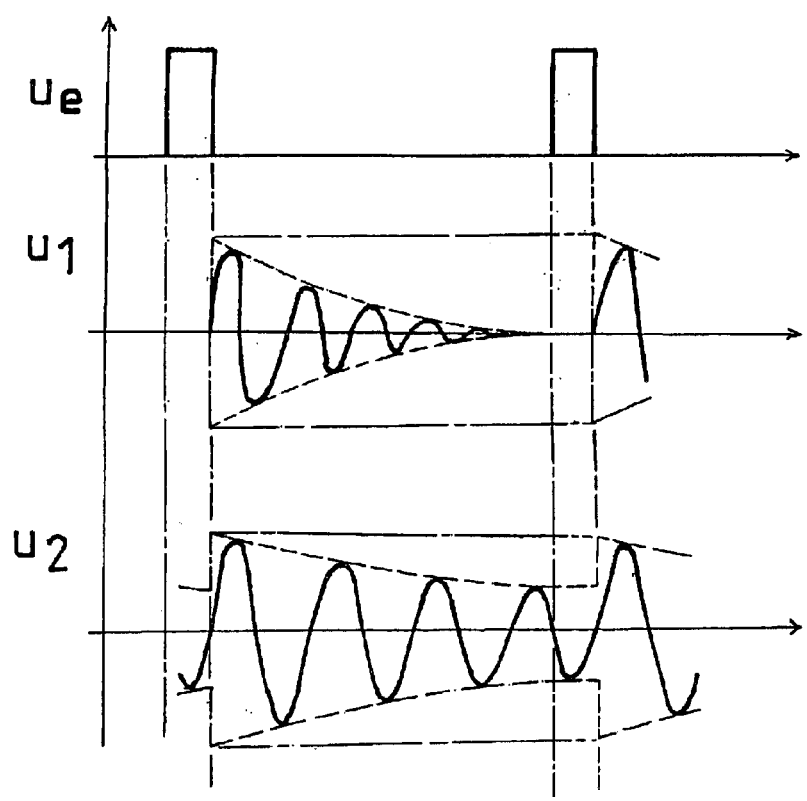
Fig_2

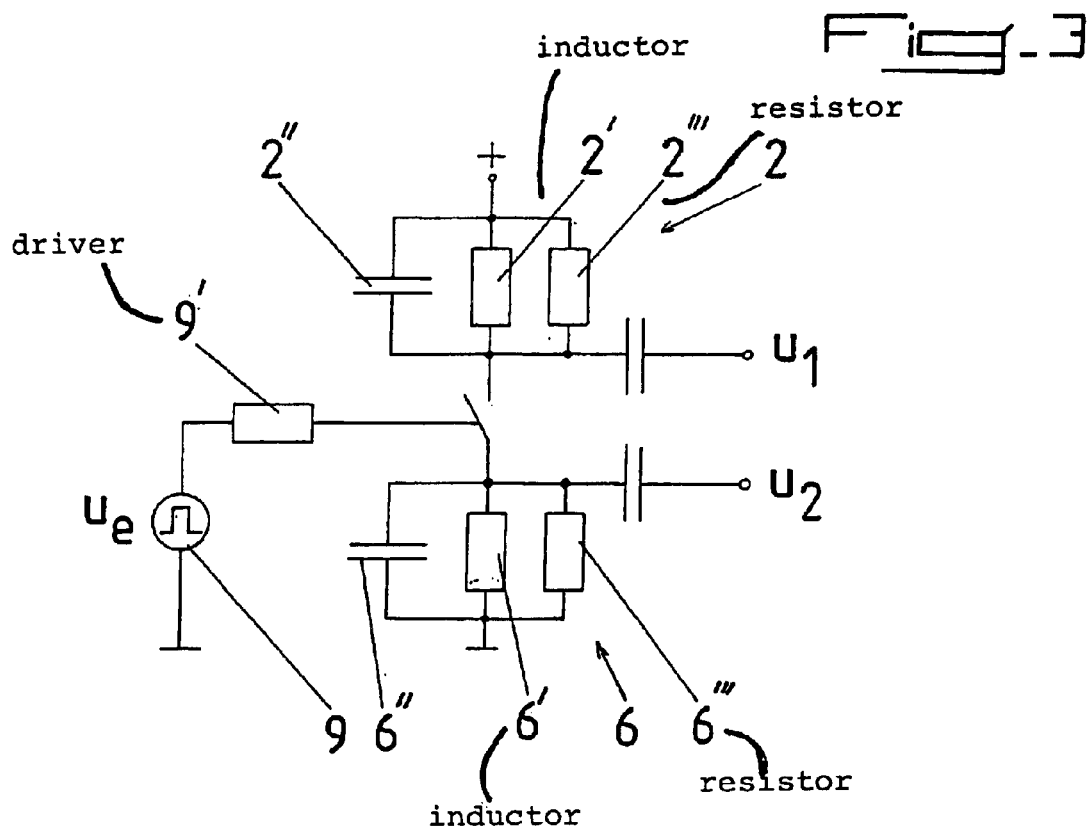
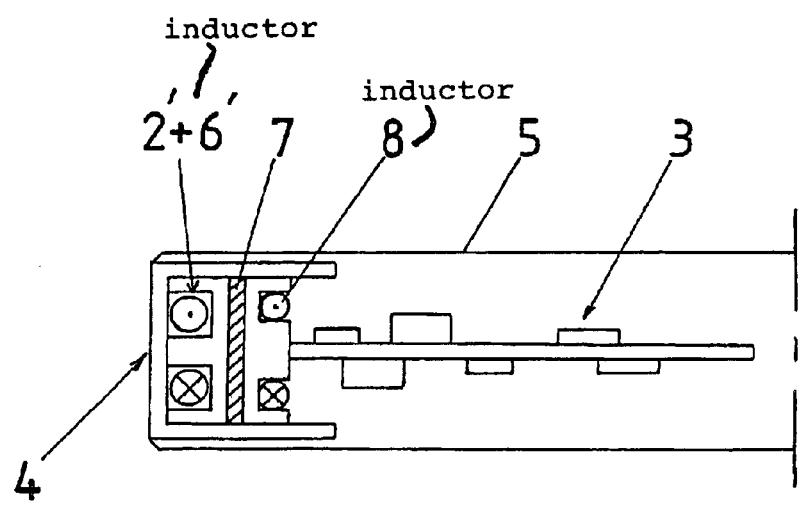

INDEPENDENTLY EXCITED PROXIMITY OR PRESENCE SWITCH ARRANGEMENT

BACKGROUND OF THE INVENTION

The present invention relates to the field of detection and sensing by means of electronic sensors or detectors, in particular metal objects, and relates to a proximity or presence switch arrangement operating in accordance with the inductive principle.

Switch arrangements of this type are predominantly used in conjunction with automated operating devices (such as robots) or with safety devices, in particular in the automotive industry.

The inductors present in these switching arrangements are stored with an oscillating electrical signal and thus develop a changeable magnetic sensing field, the nature of which depends on the nature of the inductor and the features of the stored signal.

If a metal object enters the range of this field the latter is changed by the damping effects of this object. This change is then detected and evaluated in order to optionally initiate actions if predetermined conditions occur or are exceeded, such as changes in the switching state of connected switching amplifiers.

If the switching arrangements are used in an industrial environment they are exposed to influences which are disruptive to measuring and sensing, such as metallic powder or welding particles which can accumulate on the housing.

A switch arrangement of the type mentioned at the outset is already known in which an attempt is made to compensate for the influences disruptive to measuring by an additional arrangement.

However, this is a complex structure in which the compensating component itself is exposed to disruptive influences and thus cannot always optimally compensate.

In addition it should be mentioned that a constant energy supply is required in all existing aforementioned arrangements and the excitation signals are matched to the inherent oscillating frequency of the oscillating circuit containing the inductor.

SUMMARY OF THE INVENTION

One object of the invention is to eliminate at least some of the aforementioned drawbacks.

The invention therefore predominantly relates to a proximity or presence switch arrangement operating in accordance with the inductive principle, comprising at least one electronic control and evaluation device for sensing or detecting the approach and/or presence of a material influencing electromagnetic fields, characterised in that the oscillating circuit is excited at predetermined time intervals to generate an independently excited, preferably periodic oscillation, the excitation signal having a frequency which is equal to or different from the inherent oscillation frequency of the oscillating circuit, and in that the electronic device detects and evaluates the change(s) in one or more parameter (s) such as frequency, amplitude and/or phase of the generated oscillation signal, optionally comparatively with respect to at least one reference oscillation or reference values, and triggers or causes (a) corresponding action(s) if the evaluation results exceed predetermined thresholds.

The periodic, independently excited oscillation signal generated preferably has an at least slight amplitude which decays with time, the cycle of the pulse signal being at least five times, preferably at least 10 times, greater than the cycle of the oscillation generated.

The supply of energy can be drastically reduced, compared with a constant excitation, owing to the excitation with pulses of this type which are remote from one another in terms of time.

To optimise the sensitivity and the range of the switch arrangement the inductor is applied to or immediately in front of or behind the active face of the switch arrangement, the latter arrangement being housed in a protective and structural housing, optionally together with the control and evaluation device.

At least the active face of this housing preferably consists of a material which does not influence magnetic fields, or of special steel.

The action(s) triggered by the electronic control and evaluation device can, in particular, include the changing over of an interacting switching amplifier.

However, the triggered action can also correspond to the emission of a warning signal which is evaluated by a remote processing unit and which then takes appropriate measures.

The electronic device preferably contains means for scanning the periodic, independently excited oscillation signal, and optionally means for digitally filtering the signal scanned in this way.

According to a first embodiment of the invention the change(s) in the parameter(s) can be evaluated by comparison with stored reference values on the basis of the values of the parameters of the nth oscillation of each signal sequence of the periodic independently excited oscillation signal generated.

The stored reference values can be produced in an earlier parameterising phase, in identical excitation conditions and in the absence of any electromagnetic influence.

Therefore a constant imaginary oscillating circuit is provided.

According to a second embodiment of the invention the switch arrangement can comprise at least one second oscillating circuit supplied with the excitation signal in an identical manner but totally or at least partially shielded from the influence of a material influencing electromagnetic fields, the evaluation of the change(s) in at least one parameter of the periodic, independently excited oscillation signal generated by the first oscillating circuit being made by comparison with at least one identical parameter of the periodic, independently excited oscillation signal generated by the at least second oscillating circuit, after scanning and optionally digital filtering.

The inductors used can consist either of air-core inductors or inductors with pot-type cores (for example carbonyl iron).

According to an advantageous feature of the invention the components and operating features of the first and second oscillating circuit are identical.

However, the natures of the various oscillating circuits can also be different, these differences being accepted in the comparison and evaluation phase.

The inductors of the two oscillating circuits can be completely decoupled from one another or coupled to one another to a certain extent depending on the desired properties of the switch arrangement.

The condition of influencing can be adjusted to an extent on both oscillating circuits by the assembly geometry.

Therefore, the field-damping and the frequency-displacing properties of ferromagnetic materials can be exploited very sensitively but undesired effects, such as temperature influences, are eliminated. Scanning is performed owing to the independent excitation so a digital filter depth can be adjusted in accordance with the switching frequency required of the interacting switching amplifier and in relation to the frequency of the excitation oscillation used, so extremely high interference immunity is achieved.

According to an advantageous design of the invention the inductors of the first and second oscillating circuits are arranged behind one another in the housing, with respect to the active face thereof. At least one partition can also be provided between the two inductors as an electromagnetic shield.

For digital processing by the electronic device connected downstream the comparison of at least one parameter of the two periodic, independently excited oscillation signals generated is made on the basis of scanned values, scanning being synchronised with the or to the excitation signal.

BRIEF DESCRIPTION OF THE DRAWINGS

The invention will now be described in more detail with the aid of embodiments and in conjunction with the accompanying figures, in which:

FIG. 1 shows a switch arrangement according to the invention in longitudinal section;

FIG. 2 shows time graphs which each illustrate the excitation signal (Ue), the signal (U1) generated by the first oscillating circuit and the signal (reference signal U2) generated by the second oscillating circuit;

FIG. 3 shows an electric operating diagram of the oscillating circuit shown partially in FIG. 1, and FIG. 4 is a side view of a longitudinal section of a switch arrangement according to the invention in another embodiment.

DESCRIPTION OF THE PREFERRED EMBODIMENTS

As shown in FIGS. 2 and 3 a pulse generator 9 periodically generates a pulse—the pulse form plays a subordinate role here) —which excites the two oscillating circuits 2 and 6 (inductor systems) via one and the same driver stage 9'.

The two oscillating circuits 2 and 6, each provided with an inductor 2', 6', an oscillating circuit capacitor 2" and a resistor 2''', 6''', oscillate with more or less decaying amplitude, now decoupled from one another, after the excitation has been turned off—at the end of the pulse.

Whether and to what extent the amplitude decreases between two excitation pulses is up to the philosophy of the developer or depends on the specific application. The principle of the invention is maintained up to a virtually constant amplitude.

However, from this instant the two oscillating circuit systems 2 and 6 pass into a stability which firstly has to be produced as it were by the approach of an external object influencing the electromagnetic field.

The switch arrangement 1 is accordingly more insensitive so only small switching intervals can be achieved.

The two inductors 2' and 6' of the oscillating circuits 2 and 6 are arranged geometrically behind one another and are separated by a more or less thick decoupling layer 7. The two inductors 2' and 6' are separated for the reason that only the inductor 2' positioned toward the aperture can be influenced by an approaching metal object (damping element "BE").

The inductors do not have to be completely decoupled but can also be more or less desirably coupled to achieve particular properties of the switch arrangement 1.

However, the sensitivity also decreases as a result, with the same consequences.

A system with decaying amplitude between the excitation pulses and completely decoupled inductors describes the highest sensitivity to be achieved and thus also the greatest switching interval.

Completely coupled inductors consequently lead to complete insensitivity as a correlation serves for evaluation.

Extensions to the arrangement 1 by one or more additional inductors 8 for achieving specific properties are also conceivable (for example temperature compensation) and do not affect the principle (see FIG. 4).

A damping element influences the oscillation of the aperture inductor—here 2' with respect to the more or less decoupled inductor 6'—in the following parameters:

1. decay time constant T/damping A
2. frequency f
3. maximum amplitude
4. phase

Depending on the material of the damping element this or another influence predominates on the decaying oscillation.

An amplification with an increase in the amplitudes and greater decaying time constants can also occur.

The sensitivity is greatly improved owing to the differentiation, so very large ranges can be achieved.

It is possible to form the difference from the original oscillations or only from the envelope curve.

A further feature of this principle consists in that a scan can be performed after each excitation pulse, at the instant of which the differential signal is scanned.

This long known technique (but not in conjunction with inductive sensors) allows great filter depths, so a synchronisation is introduced eliminating every disturbance generally occurring asynchronously.

This is an effective form of protection in particular in the welding area with very strong disturbance fields which bring virtually every core material to saturation. Owing to the invention disturbances no longer penetrate to the decision threshold (BE yes or no) even in air-core inductors.

The invention is, of course, not restricted to the embodiments described and illustrated. Changes, for example in the embodiments of the various components, or replacements by technical equivalents are always possible provided they are within the scope of the claimed protection.

What is claimed is:

1. A proximity or presence switch arrangement operating in accordance with the inductive principle, comprising at least one inductor integrated in an oscillating circuit and an electronic control and evaluation device connected downstream for sensing or detecting the approach and/or presence of a material influencing electromagnetic fields, characterised in that the oscillating circuit (2) is excited at predetermined time intervals to generate an independently excited, the excitation signal having a frequency which is equal to or different from the inherent oscillation frequency of the oscillating circuit (2), in that the electronic device (3) detects and evaluates the change(s) in one or more parameter(s) and triggers or causes (a) corresponding action(s) if the evaluation results exceed predetermined thresholds, and in that the excitation signal is a periodic pulse signal and in that the independently excited oscillation signal generated has an at least slight amplitude which decays with time, the cycle of the pulse signal being at least five times greater than the cycle of the oscillation generated.

2. Proximity or presence switch arrangement according to claim 1, characterised in that the inductor (2') is applied to or directly behind the active face (4) of the switch arrangement (1), the latter arrangement (1) being housed in a protective and structural housing (5), optionally together with the control and evaluation device (3).

3. Proximity or presence switch arrangement according to claim 1, characterised in that the action(s) triggered by the electronic control and evaluation device (3) includes, in particular, the changeover of an interacting switching amplifier.

4. A proximity or presence switch arrangement operating in accordance with the inductive principle, comprising at least one inductor integrated in an oscillating circuit and an electronic control and evaluation device connected downstream for sensing or detecting the a roach and/or presence of a material influencing electromagnetic fields, characterised in that the oscillating circuit (2) is excited at predetermined time intervals to generate an independently excited, the excitation signal having a frequency which is equal to or different from the inherent oscillation frequency of the oscillating circuit (2), in that the electronic device (3) detects and evaluates the change(s) in one or more parameter(s) and triggers or causes (a) corresponding action(s) if the evaluation results exceed predetermined thresholds, and characterised in that the electronic device (3) comprises means (3') for scanning the periodic, in independently excited oscillation signal.

5. Proximity or presence switch arrangement according to claim 1, characterised in that the change(s) in the parameter (s) is (are) evaluated by comparison with stored reference values on the basis of the values of the parameters of the nth oscillation of each signal sequence of the periodic, independently excited oscillation signal generated.

6. Proximity or presence switch arrangement according to claim 1, characterised in that it comprises at least a second oscillating circuit (6) supplied with the excitation signal in an identical manner but totally or at least partially shielded from the influence of a material influencing electromagnetic fields, the evaluation of the change(s) in at least one parameter of the periodic, independently excited oscillation signal generated by the first oscillating circuit (2) being made by comparison with at least one identical parameter of the periodic, independently excited oscillation signal generated by the at least second oscillating circuit (6), after scanning and optionally digital filtering.

7. Proximity or presence switch arrangement according to claim 6, characterised in that the components (2', 2", 2":6', 6", 6''') and operating features of the first and second oscillating circuits (2 an 6) are identical.

8. Proximity or presence switch arrangement according to claim 6, characterised in that the inductors (2' and 6') of the two oscillating circuits (2 and 6) are completely decoupled from one another.

9. Proximity or presence switch arrangement according to claim 6, characterised in that the inductors (2' and 6') of the first and second oscillating circuits (2 and 6) are coupled to one another to a predetermined extent.

10. Proximity or presence switch arrangement according to claim 6, characterised in that the inductors (2' and 6') of the first and second oscillating circuits (2 and 6) are arranged behind one another in the housing 5) relative to the active face (4) thereof, and in that at least one partition (7) is provided between the two inductors (2' and 6') as an electromagnetic shield.

11. Proximity or presence switch arrangement according to claim 6, characterised in that the comparison of at least one of the parameters of the two periodic, independently excited oscillation signals generated is made on the basis of scanned values, scanning being synchronised with the or to the excitation signal.

12. Proximity or presence switch arrangement according to claim 6, characterised in that at least a third oscillating circuit is provided which is excited in an identical manner and is at least partially shielded from a further external physical influence and of which the periodic, independently excited oscillations generated serve as further reference oscillations.

13. Proximity or presence switch arrangement according to claim 1, wherein one or more parameters include at least one of frequency, amplitude of the generated oscillation signal, and phase of the generate oscillation signal.

14. Proximity or presence switch arrangement according to claim 13, wherein the detected and evaluated parameter is comparatively or correlatively detected and evaluated with respect to at least one reference oscillation or reference value.

15. Proximity or presence switch arrangement according to claim 4, further comprising means (3') for digitally filtering the signal scanned.

* * * * *